US011166387B2

(12) United States Patent
Yang et al.

(10) Patent No.: US 11,166,387 B2
(45) Date of Patent: Nov. 2, 2021

(54) WIRING BOARD AND MANUFACTURING METHOD THEREOF

(71) Applicant: Unimicron Technology Corp., Taoyuan (TW)

(72) Inventors: Kai-Ming Yang, Hsinchu County (TW); Chen-Hao Lin, Keelung (TW); Pu-Ju Lin, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/847,688

(22) Filed: Apr. 14, 2020

(65) Prior Publication Data

US 2021/0282275 A1 Sep. 9, 2021

(30) Foreign Application Priority Data

Mar. 6, 2020 (TW) ................................ 109107369

(51) Int. Cl.
*H05K 1/02* (2006.01)
*H05K 1/11* (2006.01)
(Continued)

(52) U.S. Cl.
CPC ......... *H05K 3/4644* (2013.01); *H05K 1/0298* (2013.01); *H05K 1/11* (2013.01); *H05K 3/22* (2013.01)

(58) Field of Classification Search
CPC ....... H05K 3/4644; H05K 3/22; H05K 1/0298
See application file for complete search history.

(56) References Cited

U.S. PATENT DOCUMENTS 10,681,824 B1 * 6/2020 Hao ..................... H05K 3/4664
2010/0319966 A1 * 12/2010 Liu ...................... H05K 3/4682
174/255

(Continued)

FOREIGN PATENT DOCUMENTS

CN 103436097 11/2015
JP 2019192885 10/2019

(Continued)

OTHER PUBLICATIONS

"Office Action of Taiwan Counterpart Application", dated Aug. 12, 2021, p. 1-p. 5.

*Primary Examiner* — Ishwarbhai B Patel
(74) *Attorney, Agent, or Firm* — JCIPRNET

(57) ABSTRACT

A wiring board including a build-up circuit layer, a patterned conductive layer, first and second adhesion promoting material layers and first and second solder mask layers is provided. The build-up circuit layer has a first surface and a second surface opposite thereto. The patterned conductive layer is disposed on the second surface. The first adhesion promoting material layer is disposed on the first surface and includes at least one first opening. The second adhesion promoting material layer is disposed on the second surface and the patterned conductive layer, and includes at least one second opening. The first solder mask layer is disposed on the first adhesion promoting material layer and includes at least one third opening provided corresponding to the first opening. The second solder mask layer is disposed on the second adhesion promoting material layer and includes at least one fourth opening provided corresponding to the second opening.

7 Claims, 3 Drawing Sheets

(51) Int. Cl.
*H05K 3/46* (2006.01)
*H05K 3/22* (2006.01)

(56) References Cited

U.S. PATENT DOCUMENTS

| | | | | |
|---|---|---|---|---|
| 2012/0048603 | A1* | 3/2012 | Huang | H05K 1/0259 |
| | | | | 174/257 |
| 2014/0102772 | A1* | 4/2014 | Chen | H05K 1/113 |
| | | | | 174/255 |
| 2015/0195902 | A1* | 7/2015 | Lee | H05K 3/4682 |
| | | | | 174/251 |
| 2016/0185498 | A1* | 6/2016 | Henderson | B32B 27/08 |
| | | | | 206/524.2 |
| 2017/0084589 | A1* | 3/2017 | Kuo | H01L 23/3128 |
| 2017/0117252 | A1* | 4/2017 | Baik | H01L 23/3128 |
| 2018/0111352 | A1* | 4/2018 | Wakamatsu | B32B 27/36 |
| 2018/0346707 | A1* | 12/2018 | Chen | C08L 53/005 |
| 2019/0206774 | A1* | 7/2019 | Rosch | H01L 21/4857 |

FOREIGN PATENT DOCUMENTS

| | | | |
|---|---|---|---|
| TW | 201039415 A | * | 11/2010 |
| TW | I496250 | | 8/2015 |

* cited by examiner

WIRING BOARD AND MANUFACTURING METHOD THEREOF

CROSS-REFERENCE TO RELATED APPLICATION

This application claims the priority benefit of Taiwan application no. 109107369, filed on Mar. 6, 2020. The entirety of the above-mentioned patent application is hereby incorporated by reference herein and made a part of this specification.

TECHNICAL FIELD

The invention relates to a wiring board and a manufacturing method thereof, and more particularly, to a wiring circuit having adhesion promoting material layers and a manufacturing method thereof.

BACKGROUND

At present, when an electroless plating surface treatment process is performed on a printed circuit board (e.g., in processes of Electroless Nickel Electroless Palladium Immersion Gold (ENEPIG), Electroless Nickel Immersion Gold (ENIG) or Electroless Palladium Immersion Gold (EPIG)), an abnormal interface penetration is often found on a bottom portion and a sidewall of an opening of a solder mask layer. As a line width or a line pitch on a printed circuit board continues to shrink (e.g., when the line width or the line pitch is less than 25 µm), the abnormal interface penetration will electrically connect adjacent circuits to cause short-circuit which affect the yield and reliability after soldering.

SUMMARY

The invention provides a wiring board with better yield and reliability.

The invention provides a manufacturing method of a wiring method, which is used for manufacturing the wiring board described above.

The wiring board of the invention includes a build-up circuit layer, a patterned conductive layer, a first adhesion promoting material layer, a second adhesion promoting material layer, a first solder mask layer and a second solder mask layer. The build-up circuit layer has a first surface and a second surface opposite to the first surface. The patterned conductive layer is disposed on the second surface of the build-up circuit layer. The first adhesion promoting material layer is disposed on the first surface of the build-up circuit layer and includes at least one first opening. The second adhesion promoting material layer is disposed on the second surface of the build-up circuit layer and the patterned conductive layer, and includes at least one second opening. The first solder mask layer is disposed on the first adhesion promoting material layer and includes at least one third opening. The third opening is provided corresponding to the first opening. The second solder mask layer is disposed on the second adhesion promoting material layer and includes at least one fourth opening. The fourth opening is provided corresponding to the second opening.

In an embodiment of the invention, the first opening and the third opening expose a part of the build-up circuit layer, and the second opening and the fourth opening expose a pad of the patterned conductive layer.

In an embodiment of the invention, materials of the first adhesion promoting material layer and the second adhesion promoting material layer include a chlorinated polyolefin and an olefin-based block copolymer.

In an embodiment of the invention, thicknesses of the first adhesion promoting material layer and the second adhesion promoting material layer are less than 1 µm.

In an embodiment of the invention, thicknesses of the first adhesion promoting material layer and the second adhesion promoting material layer are less than a thickness of the patterned conductive layer.

In an embodiment of the invention, the first adhesion promoting material layer is disposed on an interface between the first solder mask layer and the build-up circuit layer, and the second adhesion promoting material layer is disposed on an interface between the second solder mask layer and the patterned conductive layer.

In an embodiment of the invention, the build-up circuit layer includes a circuit layer. The circuit layer is exposed on the first surface of the build-up circuit layer, and the first adhesion promoting material layer is disposed on an interface between the first solder mask layer and the circuit layer.

In an embodiment of the invention, the wiring board further includes a metal finishing layer. The metal finishing layer is disposed in the first opening, the second opening, the third opening and the fourth opening.

In an embodiment of the invention, size of the first opening is smaller than or equal to size of the third opening, and size of the second opening is smaller than or equal to size of the fourth opening.

The manufacturing method of the wiring board of the invention includes the following steps. First of all, a build-up circuit layer and a patterned conductive layer are formed. The build-up circuit layer has a first surface and a second surface opposite to the first surface, and the patterned conductive layer is disposed on the second surface of the build-up circuit layer. Then, a first adhesion promoting material layer is formed on the first surface of the build-up circuit layer, and a second adhesion promoting material layer is formed on the second surface of the build-up circuit layer and the patterned conductive layer. Then, a first solder mask layer is formed on the first adhesion promoting material layer, and a second solder mask layer is formed on the second adhesion promoting material layer. The first solder mask layer includes at least one third opening, and the second solder mask layer includes at least one fourth opening. Then, a part of the first adhesion promoting material layer is removed to form at least one first opening. The first opening is provided corresponding to the third opening. Then, a part of the second adhesion promoting material layer is removed to form at least one second opening. The second opening is provided corresponding to the fourth opening.

In an embodiment of the invention, the manufacturing method of the wiring board further includes a step of: forming a metal finishing layer in the first opening, the second opening, the third opening and the fourth opening.

Based on the above, in the wiring board of the present embodiment, because the first adhesion promoting material layer is disposed on the interface between the first solder mask layer and the circuit layer and the second adhesion promoting material layer is disposed on the interface between the second solder mask layer and the patterned conductive layer, the bonding force between the first adhesion promoting material layer and the circuit layer is increased, and the bonding force between the second adhesion promoting material layer and the patterned conductive layer is increased. Therefore, compared with the prior art, when the wiring board of the present embodiment is subjected to the electroless plating surface treatment process, it is enable to avoid the abnormal interface penetration and short circuit, thereby achieving a good soldering effect and electrical conduction characteristics. In this way, the wiring board of the present embodiment can have better yield and reliability.

To make the aforementioned more comprehensible, several embodiments accompanied with drawings are described in detail as follows.

DETAILED DESCRIPTION

FIG. 1A to FIG. 1D are cross-sectional views illustrating a manufacturing method of a wiring board in an embodiment of the invention.

Figure 1A:
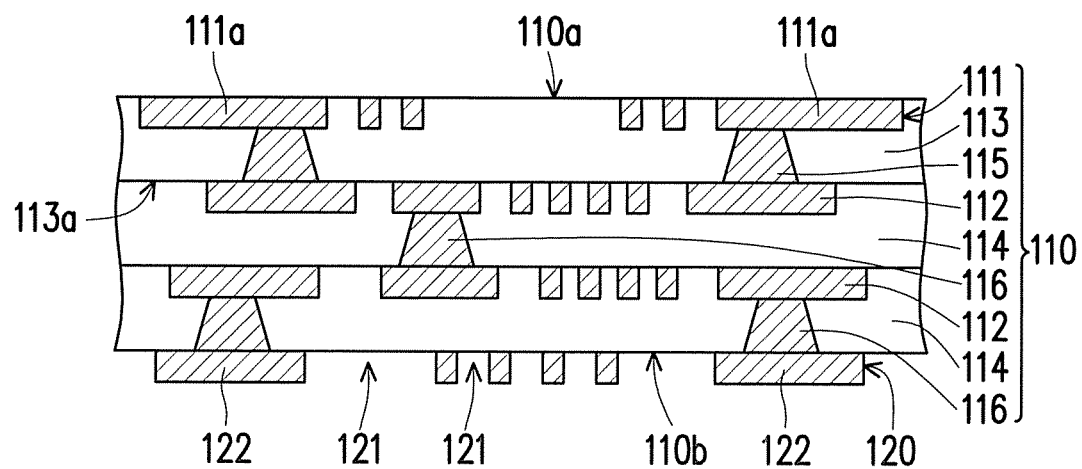
FIG. 1A to FIG. 1D are cross-sectional views illustrating a manufacturing method of a wiring board in an embodiment of the invention.

Referring to FIG. 1A, first of all, a build-up circuit layer 110 is formed. The build-up circuit layer 110 has a first surface 110a and a second surface 110b opposite to the first surface 110a. The build-up circuit layer 110 includes at least one circuit layer (111, 112), at least one dielectric layer (113, 114) and at least one conductive hole (115, 116). The dielectric layer 113 covers the circuit layer 111 so that the circuit layer 111 is embedded in the dielectric layer 113 and a pad 111a of the circuit layer 111 is exposed on a surface of the dielectric layer 113 (i.e., the first surface 110a of the build-up circuit layer 110). The circuit layer 112 and the dielectric layer 114 are sequentially stacked on a surface 113a of the dielectric layer 113. The third surface 113a and the first surface 110a are opposite to each other. The conductive hole 115 penetrates the dielectric layer 113 to electrically connect the circuit layer 111 and the circuit layer 112. The conductive hole 116 penetrates the dielectric layer 114 to electrically connect the circuit layers 112 of different layers. In some embodiments, materials of the circuit layer 111 and the circuit layer 112 are, for example, copper, but not limited thereto.

Next, a patterned conductive layer 120 is formed on the second surface 110b of the build-up circuit layer 110 so that the patterned conductive layer 120 covers a part of the build-up circuit layer 110. The patterned conductive layer 120 includes a conductive pattern gap 121 and a pad 122. The patterned conductive layer 120 is far from the circuit layer 111 but is adjacent to the circuit layer 112. The pad 122 of the patterned conductive layer 120 may be electrically connected to the circuit layer 112 through the conductive hole 116. The conductive pattern gap 121 of the patterned conductive layer 120 exposes the dielectric layer 114 of the build-up circuit layer 110. In certain embodiments, a material of the patterned conductive layer 120 is, for example, cooper, but not limited thereto.

Figure 1B:
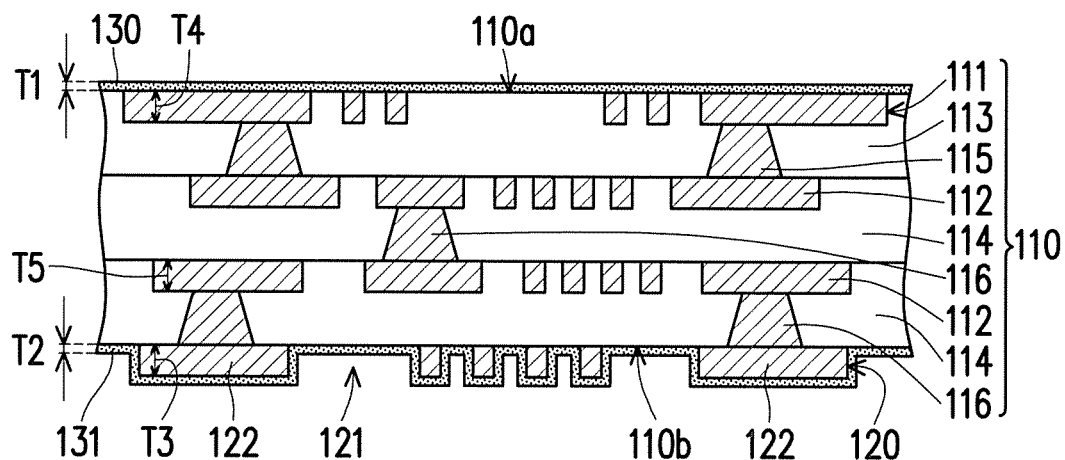

Next, referring to FIG. 1B, a first adhesion promoting material layer 130 is formed on the first surface 110a of the build-up circuit layer 110, and a second adhesion promoting material layer 131 is formed on the second surface 110b of the build-up circuit layer 110 and the patterned conductive layer 120. A method for forming the first adhesion promoting material layer 130 and the second adhesion promoting material layer 131 includes spin coating or sputtering, but not limited thereto. In this embodiment, the first adhesion promoting material layer 130 covers the circuit layer 111 and the surface of the dielectric layer 113 (i.e., the first surface 110a of the build-up circuit layer 110). The second adhesion promoting material layer 131 covers the patterned conductive layer 120, a sidewall of the conductive pattern gap 121 and a bottom portion of the conductive pattern gap 121 (i.e., the second surface 110b of the build-up circuit layer 110). In other words, the second adhesion promoting material layer 131 covers the dielectric layer 114 of the build-up circuit layer 110 exposed by the conductive pattern gap 121. In this embodiment, materials of the first adhesion promoting material layer 130 and the second adhesion promoting material layer 131 include a chlorinated polyolefin and an olefin-based block copolymer, but not limited thereto. The first adhesion promoting material layer 130 and the second adhesion promoting material layer 131 are respectively attached to the circuit layer 111 and the patterned conductive layer 120 by means of, for example, coordination chemistry, chemical bonding, diffusion force, or dipole force, so as to increase a bonding force between the first adhesion promoting material layer 130 and the circuit layer 111 and increase a bonding force between the second adhesion promoting material layer 131 and the patterned conductive layer 120.

In addition, in this embodiment, a thickness T1 of the first adhesion promoting material layer 130 and a thickness T2 the second adhesion promoting material layer 131 are both less than a thickness T3 of the patterned conductive layer 120. The thickness T1 of the first adhesion promoting material layer 130 and the thickness T2 of the second adhesion promoting material layer 131 are both less than a thickness T4 of the circuit layer 111 and a thickness T5 of the circuit layer 112. In certain embodiments, the thickness T1 of the first adhesion promoting material layer 130 and the thickness T2 of the second adhesion promoting material layer 131 are, for example, less than 1 μm, but not limited thereto.

Figure 1C:
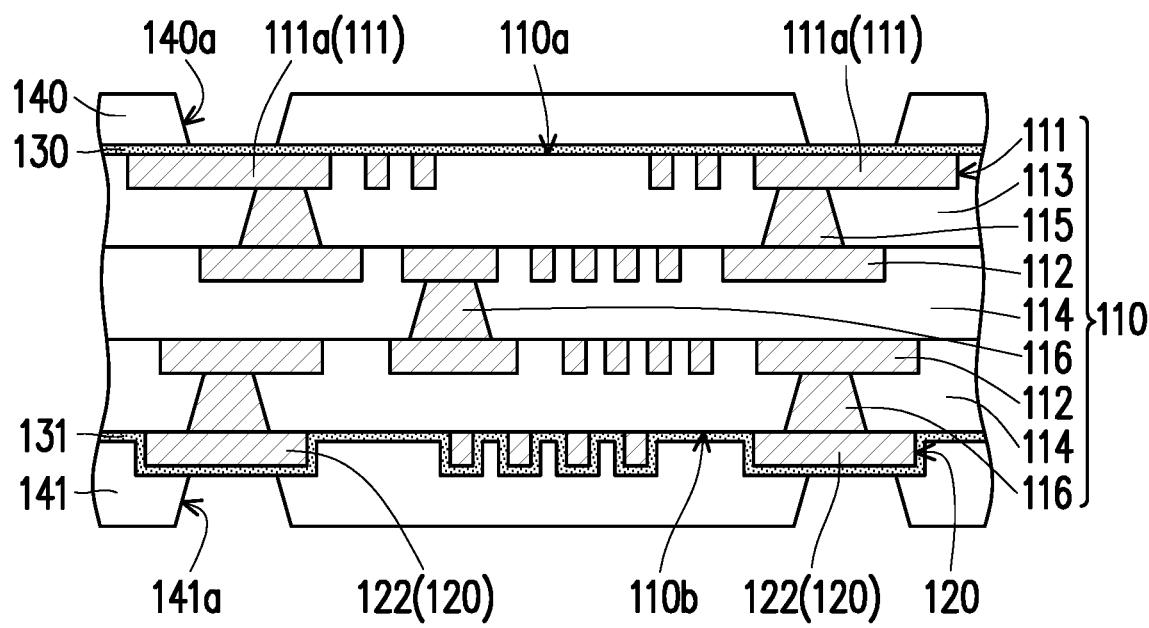

Next, referring to FIG. 1C, a first solder mask layer 140 is formed on the first adhesion promoting material layer 130, and a second solder mask layer 141 is formed on the second adhesion promoting material layer 131. The first solder mask layer 140 includes at least one third opening 140a, and the second solder mask layer 141 includes at least one fourth opening 141a. The third opening 140a exposes a part of the first adhesion promoting material layer 130, and the fourth opening 141a exposes a part of the second adhesion promoting material layer 131.

In this embodiment, the first adhesion promoting material layer 130 can form a permanent covalent bond with the first solder mask layer 140 to increase a bonding force between the first adhesion promoting material layer 130 and the first solder mask layer 140. The second adhesion promoting material layer 131 can form a permanent covalent bond with the second solder mask layer 141 to increase a bonding force between the second adhesion promoting material layer 131 and the second solder mask layer 141.

Figure 1D:
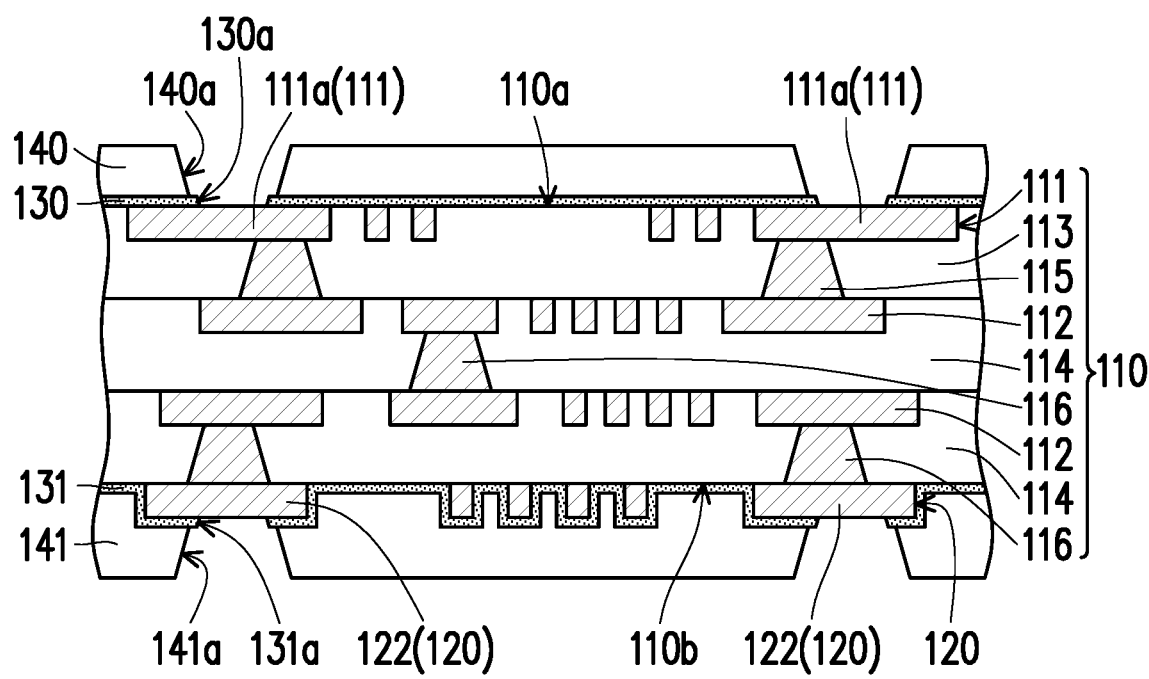

Next, referring to FIG. 1D, a part of the first adhesion promoting material layer 130 exposed by the third opening 140a is removed to form at least one first opening 130a, and a part of the second adhesion promoting material layer 131 exposed by the fourth opening 141a is removed to form at least one second opening 131a. Specifically, size of the first opening 130a may be smaller than or equal to size of the third opening 140a, and size of the second opening 131a may be smaller than or equal to size of the fourth opening 141a. Accordingly, the first opening 130a is provided corresponding to the third opening 140a, and the second opening 131a is provided corresponding to the fourth opening 141a. In this embodiment, the first opening 130a and the third opening 140a expose a part of the build-up circuit layer 110 (i.e., the pad 111a of the circuit layer 111), and the second opening 131a and the fourth opening 141a expose the pad 122 of the patterned conductive layer 120. At this point, the wiring board 100 of this embodiment has been manufactured.

In brief, the wiring board 100 of the present embodiment includes the build-up circuit layer 110, the patterned conductive layer 120, the first adhesion promoting material layer 130, the second adhesion promoting material layer 131, the first solder mask layer 140 and the second solder mask layer 141. The build-up circuit layer 110 has a first surface 110a and a second surface 110b opposite to the first surface 110b. The patterned conductive layer 120 is disposed on the second surface 110b of the build-up circuit layer 110. The first adhesion promoting material layer 130 is disposed on the first surface 110a of the build-up circuit layer 110 and includes the at least one first opening 130a. The second adhesion promoting material layer 131 is disposed on the second surface 110b of the build-up circuit layer 110 and the patterned conductive layer 120, and includes the at least one second opening 131a. The first solder mask layer 140 is disposed on the first adhesion promoting material layer 130 and includes the at least one third opening 140a. The third opening 140a is provided corresponding to the first opening 130a. The second solder mask layer 141 is disposed on the second adhesion promoting material layer 131 and includes the at least one fourth opening 141a. The fourth opening 141a is provided corresponding to the second opening 131a.

Further, in this embodiment, the first adhesion promoting material layer 130 is disposed on an interface between the first solder mask layer 140 and the build-up circuit layer 110; the second adhesion promoting material layer 131 is disposed on an interface between the second solder mask layer 141 and the patterned conductive layer 120 and disposed on an interface between the second solder mask layer 141 and the build-up circuit layer 110. In certain embodiments, the first adhesion promoting material layer 130 is disposed on an interface between the first solder mask layer 140 and the circuit layer 111. In certain embodiments, the first adhesion promoting material layer 130 is disposed on the interface between the first solder mask layer 140 and the pad 111a, and the second adhesion promoting material layer 131 is disposed on an interface between the second solder mask layer 141 and the pad 122. In other words, two sides of the first adhesion promoting material layer 130 are respectively in contact with the first solder mask layer 140 and the pad 111a, and two sides of the second adhesion promoting material layer 131 are respectively in contact with the second solder mask layer 141 and the pad 122.

In the wiring board 100 of the present embodiment, because the first adhesion promoting material layer 130 is disposed on the interface between the first solder mask layer 140 and the circuit layer 111 and the second adhesion promoting material layer 131 is disposed on the interface between the second solder mask layer 141 and the patterned conductive layer 120, the bonding force between the first adhesion promoting material layer 130 and the circuit layer 111 is increased and the bonding force between the second adhesion promoting material layer 131 and the patterned conductive layer 120 is increased. Therefore, compared with the prior art, when the wiring board 100 of the present embodiment is subjected to the electroless plating surface treatment process, it is possible to avoid the abnormal interface penetration and short circuit, thereby achieving a good soldering effect and electrical conductive characteristics. In this way, the wiring board 100 of the present embodiment can have better yield and reliability.

Another embodiment is described below to illustrate the invention more clearly. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2:
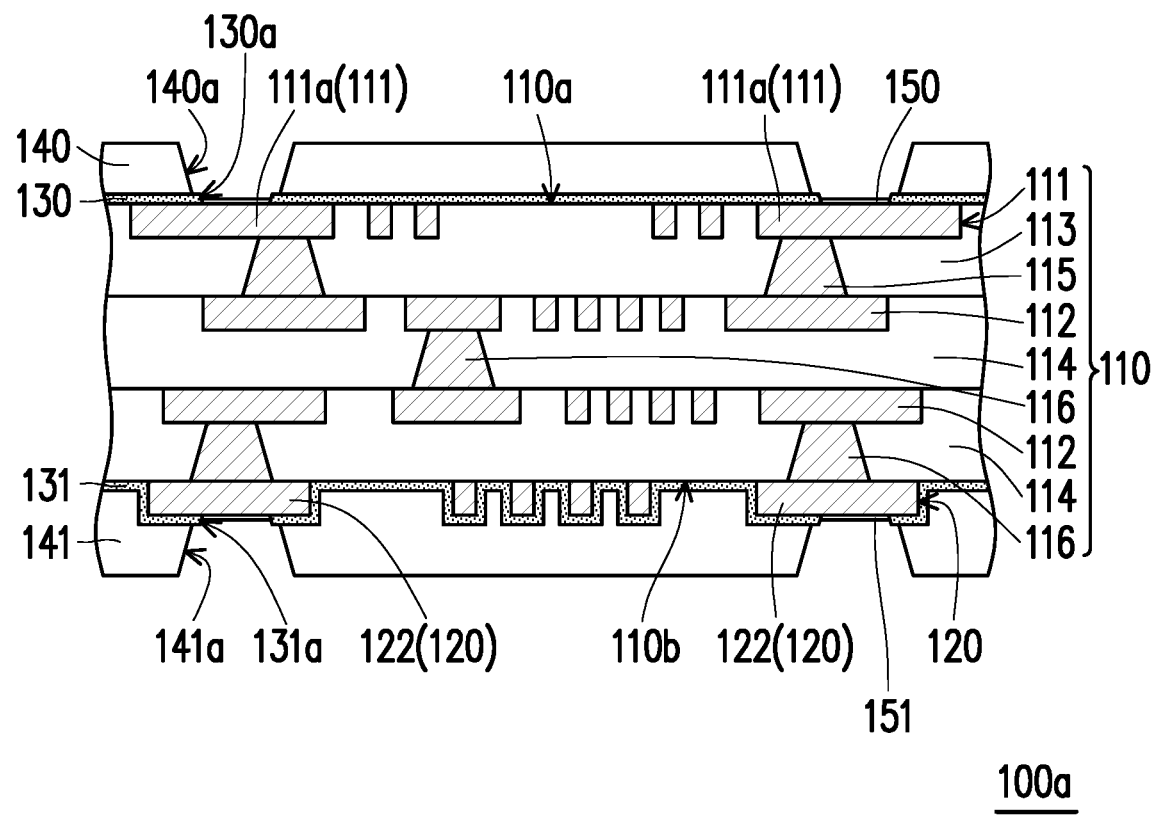
FIG. 2 is a cross-sectional view illustrating a wiring board in another embodiment of the invention.

FIG. 2 is a cross-sectional view illustrating a wiring board in another embodiment of the invention. Referring to FIG. 1D and FIG. 2 together, a wiring board 100a of the present embodiment is similar to the wiring board 100 in FIG. 1D, and yet the main difference between the two is that the circuit board 100a in this embodiment further includes a metal finishing layer (150, 151).

Specifically, referring to FIG. 2, the metal finishing layer 150 is formed in the first opening 130a and the third opening 140a, so as to cover the part of the build-up circuit layer 110 (i.e., the pad 111a of the circuit layer 111) exposed by the first opening 130a and the third opening 140a. The metal finishing layer 151 is formed in the second opening 131a and the fourth opening 141a, so as to cover the part of the pad 122 of the patterned conductive layer 120 exposed by the second opening 131a and the fourth opening 141a.

Further, in this embodiment, the metal finishing layer 150 and the metal finishing layer 151 are conductive. The metal finishing layer 150 and the metal finishing layer 151 may include a composite layer of a plurality of sub-layers formed of different materials. Materials of the metal finishing layer 150 and the metal finishing layer 151 are, for example, nickel, palladium, gold, silver, tin or a combination thereof, but not limited thereto.

In summary, in the wiring board of the present embodiment, because the first adhesion promoting material layer is disposed on the interface between the first solder mask layer and the circuit layer and the second adhesion promoting material layer is disposed on the interface between the second solder mask layer and the patterned conductive layer, the bonding force between the first adhesion promoting material layer and the circuit layer is increased and the bonding force between the second adhesion promoting material layer and the patterned conductive layer is increased. Therefore, compared with the prior art, when the wiring board of the present embodiment is subjected to the electroless plating surface treatment process, it is possible to avoid the abnormal interface penetration and short circuit, thereby achieving a good soldering effect and electrical conductive characteristics. In this way, the wiring board of the present embodiment can have better yield and reliability.

Although the present disclosure has been described with reference to the above embodiments, it will be apparent to one of ordinary skill in the art that modifications to the described embodiments may be made without departing from the spirit of the disclosure.

Accordingly, the scope of the disclosure will be defined by the attached claims and not by the above detailed descriptions.

The invention claimed is:
1. A wiring board, comprising:
a build-up circuit layer, having a first surface and a second surface opposite to the first surface;

a patterned conductive layer, disposed on the second surface of the build-up circuit layer;

a first adhesion promoting material layer, disposed on the first surface of the build-up circuit layer, and comprising at least one first opening;

a second adhesion promoting material layer, disposed on the second surface of the build-up circuit layer and the patterned conductive layer, and comprising at least one second opening;

a first solder mask layer, disposed on the first adhesion promoting material layer, and comprising at least one third opening, the third opening being provided corresponding to the first opening; and a second solder mask layer, disposed on the second adhesion promoting material layer, and comprising at least one fourth opening, the fourth opening being provided corresponding to the second opening, wherein thicknesses of the first adhesion promoting material layer and the second adhesion promoting material layer are less than a thickness of the patterned conductive layer, and the thicknesses of the first adhesion promoting material layer and the second adhesion promoting material layer are less than 1 μm, wherein there is a first bonding force between the first adhesion promoting material layer and the build-up circuit layer, and there is a second bonding force between the second adhesion promoting material layer and the patterned conductive layer, wherein materials of the first adhesion promoting material layer and the second adhesion promoting material layer comprise a chlorinated polyolefin and an olefin-based block copolymer.

2. The wiring board according to claim 1, wherein the first opening and the third opening expose a part of the build-up circuit layer, and the second opening and the fourth opening expose a pad of the patterned conductive layer.

3. The wiring board according to claim 1, wherein the first adhesion promoting material layer is disposed on an interface between the first solder mask layer and the build-up circuit layer, and the second adhesion promoting material layer is disposed on an interface between the second solder mask layer and the patterned conductive layer.

4. The wiring board according to claim 1, wherein the build-up circuit layer comprises a circuit layer, the circuit layer is exposed on the first surface of the build-up circuit layer, and the first adhesion promoting material layer is disposed on an interface between the first solder mask layer and the circuit layer.

5. The wiring board according to claim 1, further comprising:

a metal finishing layer, disposed in the first opening, the second opening, the third opening and the fourth opening.

6. The wiring board according to claim 1, wherein size of the first opening is smaller than or equal to size of the third opening, and size of the second opening is smaller than or equal to size of the fourth opening.

7. The wiring board according to claim 1, wherein the first bonding force and the second bonding force comprise coordination chemistry, chemical bonding, diffusion force or dipole force.

* * * * *